US011901496B2

(12) United States Patent
Ling et al.

(10) Patent No.: US 11,901,496 B2
(45) Date of Patent: Feb. 13, 2024

(54) LIGHT-EMITTING MODULE, DISPLAY MODULE AND DISPLAY DEVICE

(71) Applicant: BOE Technology Group Co., Ltd., Beijing (CN)

(72) Inventors: Qiuyu Ling, Beijing (CN); Xianqin Meng, Beijing (CN); Wei Wang, Beijing (CN); Weiting Peng, Beijing (CN); Yujiao Guo, Beijing (CN); Yishan Tian, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 336 days.

(21) Appl. No.: 17/471,184

(22) Filed: Sep. 10, 2021

(65) Prior Publication Data

US 2022/0238769 A1 Jul. 28, 2022

(30) Foreign Application Priority Data

Jan. 25, 2021 (CN) ......................... 202110097538.9

(51) Int. Cl.
*H01L 33/58* (2010.01)
*H01L 27/15* (2006.01)

(52) U.S. Cl.
CPC ............ *H01L 33/58* (2013.01); *H01L 27/156* (2013.01)

(58) Field of Classification Search
CPC .............................. H01L 33/58; H01L 27/156
See application file for complete search history.

(56) References Cited

U.S. PATENT DOCUMENTS

2005/0067944 A1* 3/2005 Masuda ................ G02B 3/005 313/503

FOREIGN PATENT DOCUMENTS

CN 1749829 A 3/2006

* cited by examiner

*Primary Examiner* — Mary Ellen Bowman
(74) *Attorney, Agent, or Firm* — Ling Wu; Stephen Yang; Ling and Yang Intellectual Property

(57) ABSTRACT

A light-emitting module, a display module and a display device are provided. The light-emitting module includes multiple light-emitting elements, a micro lens array disposed on a light-emitting side of the multiple light-emitting elements, and a low-refractive material layer disposed on a side of the micro lens array away from the multiple light-emitting elements, wherein a refractive index of the low-refractive material layer is smaller than a refractive index of the micro lens array; light emitted by the light-emitting element may be processed by the micro lens array and the low-refractive material layer to form a dot matrix light source which irradiates multiple preset opening regions which are disposed at intervals.

19 Claims, 7 Drawing Sheets

LIGHT-EMITTING MODULE, DISPLAY MODULE AND DISPLAY DEVICE

CROSS-REFERENCE TO RELATED APPLICATION

The present application claims priority of Chinese Patent Application No. 202110097538.9 filed to the CNIPA on Jan. 25, 2021, the content of which is incorporated herein by reference.

TECHNICAL FIELD

Embodiments of the present disclosure relate to, but are not limited to, the technical field of display, in particular to a light-emitting module, a display module and a display device.

BACKGROUND

In a display device, when light emitted by a light-emitting element in a light-emitting module irradiates on a display panel, a large part of the light emitted by the light-emitting element will be absorbed by an opaque region in the display panel, and the absorption of the light by the opaque region will bring about light loss, which leads to a lower utilization efficiency of light energy of the light-emitting element and a reduced light efficiency of the light-emitting element, resulting in poor display quality.

SUMMARY

The following is a summary of the subject matter described in the present disclosure in detail. This summary is not intended to limit the protection scope of the claims.

Embodiments of the present disclosure mainly provide following technical solutions.

In a first aspect, an embodiment of the present disclosure provides a light-emitting module, including:

- multiple light-emitting elements, a micro lens array disposed on a light-emitting side of the multiple light-emitting elements, and a low-refractive material layer disposed on a side of the micro lens array away from the light-emitting elements,
- wherein a refractive index of the low-refractive material layer is smaller than a refractive index of the micro lens array; and
- light emitted by the light-emitting elements is processed by the micro lens array and the low-refractive material layer to form a dot matrix light source which irradiates multiple preset opening regions disposed at intervals.

In a second aspect, an embodiment of the present disclosure provides a display module, including any of the above-mentioned light-emitting modules and a display panel on a light-emitting side of the light-emitting module,

- wherein the display panel includes multiple pixel opening regions and opaque regions disposed between adjacent pixel opening regions;
- the multiple preset opening regions are disposed in correspondence with the multiple pixel opening regions.

In a third aspect, an embodiment of the present disclosure provides a display device including any of the above display panels.

Other features and advantages of the present disclosure will be described in the following description, and will be partially apparent from the description, or understood by implementation of the present disclosure. Other advantages of the present disclosure may be implemented and achieved by the solutions described in the specification and accompanying drawings.

Other aspects may be comprehended upon reading and understanding of the drawings and the detailed descriptions.

BRIEF DESCRIPTION OF DRAWINGS

The drawings provide an understanding of technical solutions of the present disclosure, form a part of the specification, and are used to explain, together with the embodiments of the present disclosure, the technical solutions of the present disclosure and are not intended to form limitations on the technical solutions of the present disclosure. Shapes and sizes of each component in the drawings do not reflect true scales and only to be used to schematically illustrate contents of the present disclosure.

DETAILED DESCRIPTION

Figure 1A:
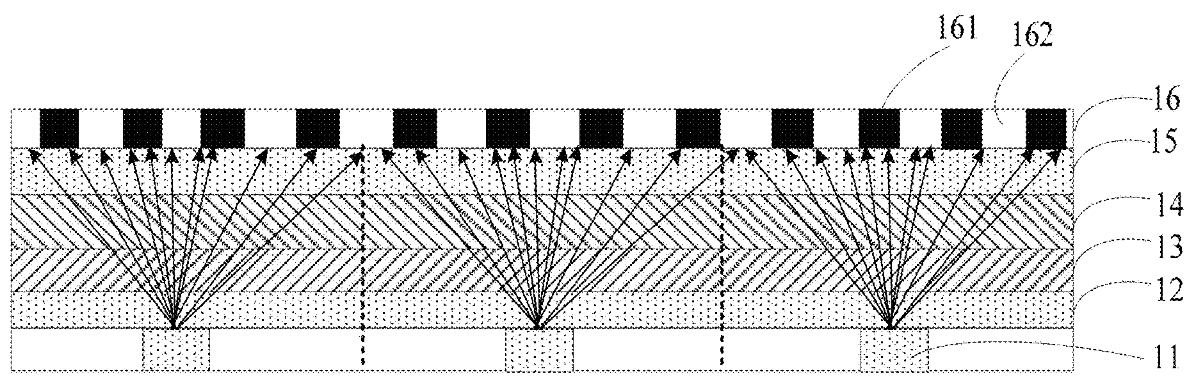
FIG. 1A is a schematic diagram of a structure of a current display module.

Multiple embodiments are described in the present disclosure, but the description is exemplary rather than restrictive, and there may be more embodiments and implementation solutions within the scope of the embodiments described in the present disclosure. Although many possible feature combinations are shown in the drawings and discussed in specific implementation modes, the disclosed features may also be combined in many other manners. Unless specifically restricted, any feature or element of any embodiment may be combined with any other feature or element in any other embodiment for use, or may take the place of any other feature or element in any other embodiment.

When describing representative embodiments, the specification may have presented methods and/or processes as a specific order of steps. However, the method or the process should not be limited to the steps of the specific order on the premise that the method or the process is independent of the specific order of the steps. As understood by those of ordinary skills in the art, other orders of steps are also possible. Therefore, the specific order of steps described in the specification should not be explained as a limitation on the claims. In addition, the claims for the method and/or the process should not be limited to performing their acts in the written order, and those of skilled in the art may easily understand that these orders may change and still keep within the spirit and the scope of the embodiments of the present application.

Unless otherwise defined, technical terms or scientific terms used in the embodiments of the present disclosure shall have common meanings as construed by those of ordinary skills in the art to which the present disclosure pertains. "First", "second", and similar wordings used in the embodiments of the present disclosure do not represent any order, number, or significance but are only adopted to distinguish different components. "Include", "contain", or a similar wording means that an element or object appearing before the term covers an element or object and equivalent thereof listed after the term and does not exclude other elements or objects. "Connect", "interconnect", or similar wordings are not limited to a physical or a mechanical connection but may include an electrical connection, either direct or indirect.

In the embodiments of the present disclosure, "about" refers to a value allowed within the range of process and measurement error that is not strictly limited.

Liquid crystal is a passive light-emitting device, and a light source needs to be added to realize different gray tones by controlling rotation of liquid crystal to control the light transmittance of the liquid crystal display panel. The light source is called a light-emitting element. In product applications, light-emitting elements and their drive circuits, optical film layers for improving optical performance and other accessory components are usually integrated into a component that may be directly used cooperatively with liquid crystal display panels, that is, a light-emitting module. Generally, a Liquid Crystal Display (LCD) device consists of a light-emitting module and a display panel (including multiple pixel opening regions 162 and opaque regions 161 disposed between adjacent pixel opening regions 162). As shown in FIG. 1A, in a conventional display device, a light-emitting module generally includes the following parts: a light-emitting element 11, a first diffuser 12, a first prism sheet 13 and a second prism sheet 14 orthogonal to each other, and a second diffuser 15. In order to ensure brightness uniformity of back light, multiple optical film layers (including the first diffuser 12, the first prism sheet 13 and the second prism sheet 14 orthogonal to each other, and the second diffuser 15) are usually used to homogenize light emitted by the light-emitting element 11. In this way, on the one hand, because both the prism sheet and the diffuser have certain transmittance, part of the light efficiency will be lost, resulting in a decrease in the light efficiency of the light-emitting element. On the other hand, the light emitted by the light-emitting element 11 will become a uniform area light source after being homogenized by the multiple optical film layers. When the area light source irradiates the display panel 16, due to a structural limit of pixel openings in the display panel 16, a large part of the light from the area light source will irradiate the opaque regions 161 in the display panel, which will be absorbed by the opaque regions 161, and the absorption of the light by the opaque regions 161 will re-bring light loss, thereby resulting in a further decrease in the light efficiency of the light-emitting element 11. In addition, considering the effect of light uniformity, it is generally necessary to use optical film layers with a larger thickness for light uniformity, which will lead to a thicker overall thickness of the light-emitting module.

Figure 1B:
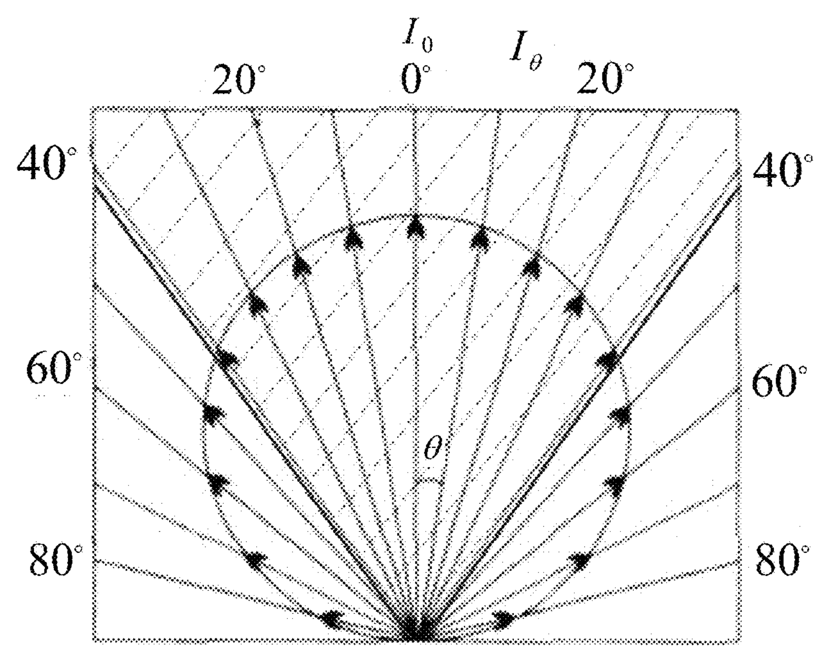
FIG. 1B is a schematic diagram of light emission of a Lambert body light source.

For example, taking a light-emitting element being an LED (light-emitting Diode) light source (e.g., Mini-led light source) as an example, FIG. 1B is a schematic diagram of light emission of a Lambert body light source, as shown in FIG. 1B, the Mini-led light source is usually a Lambert body light source (solid lines in FIG. 1B). Next, as shown in FIG. 1A, light emitted by the Mini-led light source will disperse into a large light spot. Since a light-emitting angle of the Mini-led light source is large, the light emitted by the Mini-led light source not only irradiates the pixel opening regions 162 in the display panel 16, but also a large part of the light irradiates the opaque regions 161, and the light irradiating the opaque regions 161 will be absorbed by the opaque regions 161, thereby reducing the light efficiency of the light-emitting element. Here, FIG. 1A shows a case where three Mini-led light sources irradiate the display panel.

An embodiment of the present disclosure provides a light-emitting module, which may include multiple light-emitting elements, a micro lens array disposed on a light-emitting side of the multiple light-emitting elements, and a low-refractive material layer disposed on a side of the micro lens array away from the multiple light-emitting elements, wherein a refractive index of the low-refractive material layer is smaller than a refractive index of the micro lens array. Light emitted by the light-emitting elements may be processed by the micro lens array and the low-refractive material layer to form a dot matrix light source which irradiates multiple preset opening regions which are disposed at intervals.

In this way, the formed dot matrix light source may directly converge and irradiate the preset opening regions, that is, the light emitted by the light-emitting elements directly irradiate into the light-transmissive preset opening regions (that is, a position of an imaging point of a micro lens is a position of a preset opening region). In this way, when the light-emitting module is applied to a display device, on the one hand, it may increase light irradiating the light-transmissive regions and reduce light irradiating the opaque regions, so that more light may be emitted from the light-transmissive regions for display, and light loss caused by the light irradiating the opaque regions can be reduced, thereby improving utilization efficiency of light energy of the light-emitting elements and achieving effects of improving display brightness and display quality. In addition, use of optical film layer structures such as diffusers and prism sheets can be omitted, a thickness of the display device can be reduced, light loss caused by the optical film layer structures such as diffusers and prism sheets can be reduced, and light efficiency of the light-emitting element can be further improved.

Hereinafter, a technical solution of the present disclosure will be described in detail by taking an example in which the light-emitting module is applied to the display panel.

Figure 2:
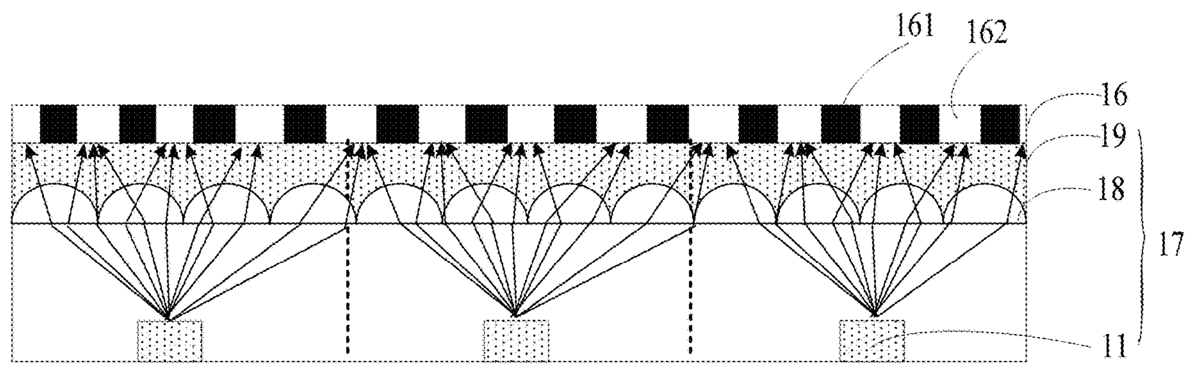
FIG. 2 is a schematic diagram of a structure of a display module according to an embodiment of the present disclosure.

An embodiment of the present disclosure provides a display panel. FIG. 2 is a schematic diagram of a structure of a display module according to an embodiment of the present disclosure. As shown in FIG. 2, the display module may include a light-emitting module 17 and a display panel 16 on a light-emitting side of the light-emitting module 17.

The display panel 16 may include multiple pixel opening regions 162 and opaque regions 161 disposed between adjacent pixel opening regions 162, wherein multiple preset opening regions are disposed in correspondence with the multiple pixel opening regions 162 in the light-emitting module;

The light-emitting module 17 may include multiple light-emitting elements 11, a micro lens array 18 disposed on a light-emitting side of the multiple light-emitting elements 11, and a low-refractive material layers 19 disposed on a side of the micro lens array 18 away from the multiple light-emitting elements 11, wherein a refractive index of the low-refractive material layer 19 is smaller than a refractive index of the micro lens array 18. Light emitted by the light-emitting elements 11 may be processed by the micro lens array 18 and the low-refractive material layer 19 to form a dot matrix light source which irradiates multiple preset opening regions which are disposed at intervals, that is, to form a dot matrix light source that irradiates multiple pixel opening regions 162.

In an exemplary embodiment, the dot matrix light source refers to a dot matrix light spot formed by dot matrix splitting of light emitted by the light-emitting elements through the micro lens array 18 and the low-refractive material layer 19.

In an exemplary embodiment, the display panel may be a Thin Film Transistor-Liquid Crystal Display (TFT-LCD) panel, or an electronic ink display panel, or other display panels, such as an electro wetting display panel, which are not limited in the embodiments of the present disclosure here.

Figure 3:
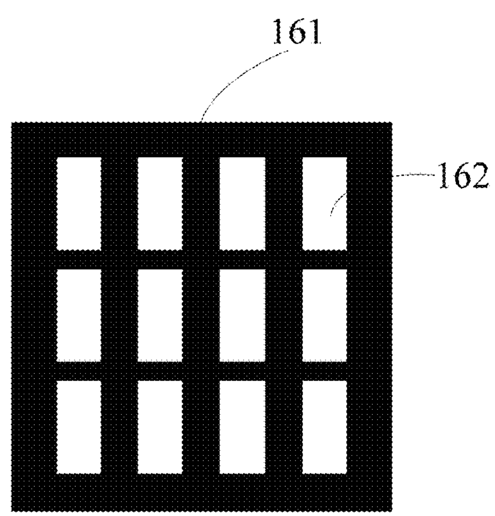
FIG. 3 is a schematic diagram of pixel opening regions and opaque regions in a display panel.

In an exemplary embodiment, a pixel opening region may be an effective display region of a pixel, and the opaque regions are correspondingly provided with a light shielding layer. For example, the light shielding layer may be on an array substrate. For example, the light shielding layer may be a Black Matrix (BM), which is configured to avoid crosstalk between adjacent pixels and shield light irradiated on the thin film transistors. For example, as shown in FIG. 3, all regions except the pixel opening regions are covered by the black matrix.

In an exemplary embodiment, an orthographic projection region of multiple preset opening regions in a thickness direction of the display panel at least partially overlaps with an orthographic projection region of multiple pixel opening regions in the thickness direction of the display panel.

In an exemplary embodiment, the multiple preset opening regions and the multiple pixel opening regions in the light-emitting module are disposed in one-to-one correspondence.

For example, the multiple preset opening regions in the light-emitting module are disposed in the multiple pixel opening regions in one-to-one correspondence.

In this way, the micro lens array and the low-refractive material layer are used to perform dot matrix splitting on light emitted by the light-emitting elements to form a dot matrix light source, and the light from the dot matrix light source may be directly converged to irradiate the preset opening regions, which are disposed in one-to-one correspondence with the pixel opening regions of the display panel, so that the light emitted by the light-emitting elements may directly irradiate into the pixel opening regions (i.e., a position of an imaging point of a micro lens is a position of a preset opening region). In this way, the light irradiating the pixel opening regions in the display panel is increased, and the light irradiating the opaque regions in the display panel is reduced, so that more light is emitted from the pixel opening regions for display, and light loss caused by the light emitted by the light-emitting elements irradiating the opaque regions is reduced, thereby improving utilization efficiency of light energy of the light-emitting elements and achieving effects of improving display brightness and display quality. In addition, the micro lens array and the low-refractive material layer are used to directly irradiate the light emitted by the light-emitting elements into the pixel opening regions of the display panel, and use of optical film layer structures such as diffusers and prism sheets can be omitted, a thickness of the display panel can be reduced, light loss caused by the optical film layer structures such as diffusers and prism sheets can be reduced, and light efficiency of the light-emitting elements can be further improved.

In an exemplary embodiment, in a thickness direction of the display module, a distance between light-emitting surfaces of the multiple light-emitting elements and a light incident surface of the display panel may be 0.5 mm to 1.5 mm. Therefore, the light efficiency of dot matrix splitting can be better, more light can irradiate into the pixel opening regions of the display panel, the light loss caused by the light irradiation to the opaque regions can be avoided, and the light efficiency of the light-emitting elements can be further improved.

In an exemplary embodiment, the light-emitting elements may be LED light sources, Mini-led light sources, etc., which are not limited here in the embodiment of the present disclosure.

In an exemplary embodiment, the light-emitting elements may be white light sources.

The light-emitting elements may be, for example, white Mini-leds.

In an exemplary embodiment, of the multiple light-emitting elements may be disposed in a quadrangular manner, or may be disposed in a regular triangular manner. In this way, light energy of each light-emitting element can be utilized more efficiently.

In an exemplary embodiment, the Micro lens array on the light-emitting side of the light-emitting elements is one of the important micro-optical elements, which is an array formed by arranging multiple lenses (i.e., micro lenses) with light transmission apertures and relief depths of micron level along a row direction and a column direction, wherein adjacent micro lenses are closely connected. By designing shapes, curvature radius, arrangement cycle, thickness and other parameters of the micro lenses, modulation functions such as shaping, homogenizing and focusing the incident light can be realized. The arrangement cycle of the micro lenses may refer to a distance between adjacent micro lenses in the micro lens array (i.e., a distance between adjacent micro lenses), which may characterize a degree of close contact between the adjacent micro lenses.

In an exemplary embodiment, a refractive index of the low-refractive material layer may be 1.2 to 1.4. For example, the refractive index of the low-refractive material layer may be 1.4.

In an exemplary embodiment, the low-refractive material layer may be made of an organic material.

In an exemplary embodiment, a thickness of the low-refractive material layer may be greater than or equal to a maximum thickness of the micro lenses in the micro lens array in a thickness direction of the light-emitting module (i.e., an arch height of the micro lenses), and smaller than an image distance of the micro lenses in the micro lens array.

In addition, the low-refractive material layer may also play a role of flattening a lens curved surface of the micro lens array, which facilitates processing and attaching other film layers on a side of the micro lens array away from the light-emitting elements.

In an exemplary embodiment, a refractive index of the micro lens array may be 1.492 to 1.6.

In an exemplary embodiment, the micro lens array layer may be made of polymethyl methacrylate (PMMA) material, or cycloolefin copolymer (COC) optical material, or other materials, such as materials with a refractive index greater than the refractive index of the low-refractive material layer, which is not limited here in the embodiment of the present disclosure.

Figure 4:
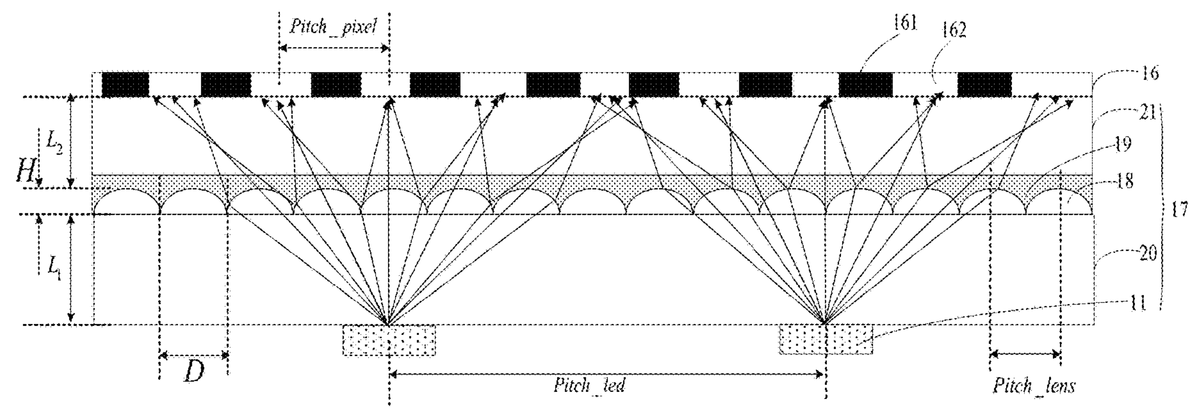
FIG. 4 is a schematic diagram of another structure of a display module according to an embodiment of the present disclosure.

In an exemplary embodiment, as shown in FIG. 4, a surface of a micro lens in the micro lens array 18 away from the light-emitting elements is a curved surface convex towards a direction away from the light-emitting elements, wherein the curved surface may be a part of a spherical surface. For example, the curved surface may be a hemispherical curved surface or in other shapes, which may be set according to requirements of thickness of the display device (such as a distance between the light-emitting surface of the light-emitting elements and the light incident surface of the display panel), which is not limited here in the embodiment of the present disclosure.

module) may be 0.0016 mm to 0.064 mm, or may be other values, which is not limited here in the embodiment of the present disclosure. For example, as shown in Table 1 below, an arch height of a single micro lens may be 0.0635 mm, 0.0423 mm, 0.0271 mm, 0.0104 mm, 0.006158 mm, 0.001639 mm, etc. Therefore, more light can irradiate into the pixel opening regions of the display panel, and higher light efficiency can be obtained.

In an exemplary embodiment, the number of micro lenses per inch may be 50 PPI (Pixels Per Inch, pixels per inch) to 5000 PPI, or may be other values, which is not limited here in the embodiments of the present disclosure. For example, as shown in Table 1 below, the number of micro lenses per inch may be 50 PPI, 200 PPI, 300 PPI, 400 PPI, 1000 PPI, 2000 PPI, 5000 PPI, etc.

TABLE 1

Lens Parameters under Different Lenses PPI

| | Lens/PPI | | | | | | |
|---|---|---|---|---|---|---|---|
| | 50 | 200 | 300 | 400 | 1000 | 2000 | 5000 |
| Diameter D of Micro lens (Unit: μm) | 508 | 127 | 84.7 | 63.5 | 25.4 | 12.7 | 5.08 |
| Curvature Radius r of Micro lens (Unit: mm) | 0.26424 | 0.0635 | 0.04235 | 0.03214 | 0.01295 | 0.006353 | 0.0027875 |
| Arch Height H of Micro lens (Unit: mm) | 0.19139 | 0.0635 | 0.0423 | 0.0271 | 0.0104 | 0.006158 | 0.001639 |
| Object Distance L1 of Micro lens (Unit: mm) | 4 | 0.5 | 0.5 | 0.5 | 0.5 | 0.5 | 0.5 |
| Image Distance L2 of Micro lens (Unit: mm) | 2.8 | 0.4 | 0.25 | 0.2 | 0.06 | 0.02 | 0.016 |

Figure 5:
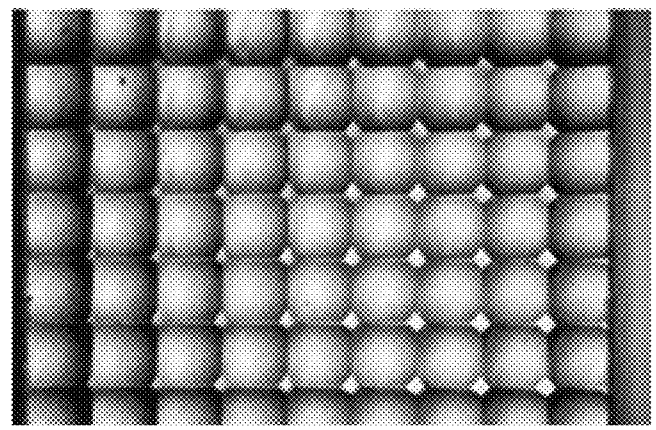
FIG. 5 is a schematic diagram of a micro lens array according to an embodiment of the present disclosure.

In an exemplary embodiment, as shown in FIG. 5, the micro lens array may include multiple micro lenses disposed in a rectangular array.

In an exemplary embodiment, taking a curved surface of a micro lens away from the light-emitting element being a part of a spherical surface as an example, a diameter D of a single micro lens (i.e., a diameter of the spherical surface of the curved surface of the micro lens away from the light-emitting element) may be 5.08 μm to 127 μm, or may be other values, which is not limited here in the embodiment of the present disclosure. For example, as shown in Table 1 below, the diameter of the micro lens may be 5.08 μm, 12.7 μm, 25.4 μm, 63.5 μm, 84.7 μm, 127 μm, etc. Therefore, more light can irradiate into the pixel opening regions of the display panel, and higher light efficiency can be obtained.

In an exemplary embodiment, taking a curved surface of a micro lens away from the light-emitting element being a part of a spherical surface as an example, a curvature radius r of a single micro lens (i.e., a radius of the spherical surface of the curved surface of the micro lens away from the light-emitting element) may be 0.0028 mm to 0.064 mm, or may be other values, which is not limited here in the embodiment of the present disclosure. For example, as shown in Table 1 below, a curvature radius of a single micro lens may be 0.0635 mm, 0.04235 mm, 0.03214 mm, 0.01295 mm, 0.006353 mm, 0.0027875 mm, etc. Therefore, more light can irradiate into the pixel opening regions of the display panel, and higher light efficiency can be obtained.

In an exemplary embodiment, taking a curved surface of a micro lens away from the light-emitting element being a part of a spherical surface as an example, an arch height H of a single micro lens (i.e., a maximum thickness of the micro lens in a thickness direction of the light-emitting In an exemplary embodiment, taking the micro lens array including multiple micro lenses disposed along a row direction and a column direction as an example, as shown in FIG. 4, in one or more of the row direction and the column direction, a distance between adjacent light-emitting elements Pitch_led (for example, a distance between center points of adjacent light-emitting elements) is larger than a distance between adjacent pixel opening regions Pitch_pixel (for example, a distance between center points of two adjacent pixel opening regions).

In an exemplary embodiment, taking the micro lens array including multiple micro lenses disposed along a row direction and a column direction as an example, as shown in FIG. 4, in one or more of the row direction and the column direction, the distance between adjacent light-emitting elements Pitch_led is larger than a distance between adjacent micro lenses Pitch_lens (for example, a distance between vertices of convex surfaces of two adjacent micro lenses).

In practical application, taking the micro lens array including multiple micro lenses disposed along a row direction and a column direction as an example, in order to improve light efficiency of dot matrix splitting, an arrangement cycle of the light-emitting elements is related to arrangement cycles of micro lenses and pixel opening regions in one or more of the row and column directions, wherein the arrangement cycle of light-emitting elements may refer to a distance between adjacent light-emitting elements among the multiple light-emitting elements (i.e., a distance between adjacent light-emitting elements), which may represent a degree of close contact between the adjacent light-emitting elements. The arrangement cycle of the micro lenses may refer to a distance between adjacent micro lenses in the micro lens array (i.e., a distance between adjacent micro lenses), which may characterize a degree of close contact between the adjacent micro lenses. The arrangement cycle of pixel opening regions may refer to a distance between adjacent pixel opening regions (i.e., a distance between the adjacent pixel opening regions) among the multiple pixel opening regions on the display panel, which may characterize a degree of close contact between the adjacent pixel opening regions.

In an exemplary embodiment, taking the micro lens array including multiple micro lenses disposed along a row direction and a column direction as an example, in one or more of the row direction and the column direction, the distance between adjacent light-emitting elements Pitch_led may be a second integer multiple of the distance between adjacent pixel opening regions Pitch_pixel, and the distance between the adjacent light-emitting elements Pitch_led may be a first integer multiple of the distance between adjacent micro lenses Pitch_lens. Herein, the first integer and the second integer are positive integers greater than 1. In this way, light efficiency of dot matrix splitting can be improved, and further, utilization rate of light of the light-emitting element can be improved.

In an exemplary embodiment, the first integer may or may not be equal to the second integer. It may be determined by a person skilled in the art according to actual situations, which is not limited here in the embodiments of the present disclosure.

In an exemplary embodiment, taking the micro lens array including multiple micro lenses disposed along a row direction and a column direction as an example, a distance between adjacent light-emitting elements in one or more of the row direction and the column direction may be 2 to 20 times a distance between adjacent pixel opening regions. In this case, the second integer may be any positive integer from 2 to 20. Therefore, the back light efficiency can be improved and the thickness of the display panel can be greatly reduced.

In an exemplary embodiment, taking the micro lens array including multiple micro lenses disposed along a row direction and a column direction as an example, in one or more of the row direction and the column direction, a distance between adjacent light-emitting elements may be 2 to 20 times that of adjacent micro lenses. At this time, the first integer may be any positive integer from 2 to 20. Therefore, the back light efficiency can be improved and the thickness of the display panel can be greatly reduced.

In an exemplary embodiment, as shown in FIG. 4, the light-emitting module 17 may further include a first substrate 20 and a second substrate 21, wherein the first substrate 20 is disposed on a side of the micro lens array 18 close to the multiple light-emitting elements 11, and a refractive index of the first substrate is greater than that of the low-refractive material layer; The second substrate 21 is disposed on a side of the low-refractive material layer 19 away from the multiple light-emitting elements 11, and a refractive index of the second substrate is greater than that of the low-refractive material layer.

In an exemplary embodiment, the first substrate and the second substrate may be made of a glass material. Therefore, due to a thin thickness of the glass substrates, not only can light efficiency of the light-emitting elements be improved, but also the brightness and display effect of the display panel can be improved, and the thickness of the display panel can be greatly reduced.

In an exemplary embodiment, an object distance of the micro lenses in the micro lens array is a thickness of the first substrate, and an image distance of the micro lenses in the micro lens array is a thickness of the second substrate.

In an exemplary embodiment, the first substrate and the second substrate are used as image spaces for imaging of the micro lens array, so that positions of imaging points of the micro lens array are positions of the pixel opening regions in the display panel. Therefore, the thicknesses of the first substrate and the thicknesses of the second substrate may be set according to a focal length the lenses of the micro lens array.

In an exemplary embodiment, the thickness of the first substrate is greater than that of the second substrate.

In an exemplary embodiment, the thickness of the first substrate (i.e., an object distance L1 of the micro lenses) may be greater than or equal to 0.5 mm, or may be other values, which is not limited here in the embodiments of the present disclosure. For example, as shown in Table 1, the thickness of the first substrate may be 0.5 mm. Therefore, more light may irradiate into the pixel opening regions of the display panel, and higher light efficiency can be obtained.

In an exemplary embodiment, the thickness of the second substrate (i.e., an image distance L2 of the micro lenses) may be 0.016 mm to 0.4 mm, or may be other values, which is not limited here in the embodiments of the present disclosure. For example, as shown in Table 1, the thickness of the second substrate may be 0.4 mm, 0.25 mm, 0.2 mm, 0.06 mm, 0.02 mm, 0.016 mm, etc.

For example, taking a Mini-led with a diameter of 0.1 mm as an example, a diameter of a micro lens may be 84.7 μm, at this time, an object distance (that is, the thickness of the first substrate) of the micro lens may be 0.5 mm, an image distance (that is, the thickness of the second substrate) of the micro lens may be 0.25 mm, a curvature radius of the micro lens may be 0.04235 mm. An arch height of the micro lens may be 0.04235 mm. The pixel opening regions has a PPI of 214. A distance between adjacent Mini-leds may be 1.2705 mm. A distance between adjacent micro lenses may be 300 In some conventional display panels, for a Mini-led with a size of 0.1 mm, a diffuser with a thickness of 2 mm is usually used to achieve back light uniformity. In this way, compared with a conventional display module, because the thickness of the glass substrate is small, not only can light efficiency and brightness of the display module be improved, but also a thickness of the display module can be greatly reduced.

For example, FIG. 4 shows a case where light from two light-emitting elements (e.g., Mini-leds) exits after passing through the display panel. It may be found that due to a large light-emitting angle of the Mini-leds, the light emitted by the Mini-leds is dispersed into a large light spot after passing through the first substrate 20. Since these light beams enter the micro lens array 18 from different angles, and a refractive index of the low-refractive material layer 19 is smaller than that of the micro lens array 18. Therefore, after passing through the micro lens array 18 and the low-refractive material layer 19, these light beams will be imaged by the micro lens array 18 to different pixel opening regions 162 of the display panel 16, that is, the light emitted by the light-emitting elements 11 will directly irradiate into each pixel opening region 162. In this way, the light irradiating the pixel opening regions in the display panel is increased, and light irradiating the opaque regions in the display panel is reduced, so that more light is emitted from the pixel opening regions for display, and light loss caused by back light irradiation to the opaque regions is reduced, thereby improving utilization efficiency of light energy of the light-emitting elements and achieving effects of improving display brightness and display quality.

It may be seen from the above that the light emitted by the light-emitting elements enters the first substrate, then is transmitted through the first substrate, and then is subjected to dot matrix splitting by using the micro lens array and the low-refractive material layer. After the light is transmitted through the second substrate, the formed dot matrix light source may directly converge and irradiate to the preset opening regions, wherein the preset opening regions and the pixel opening regions of the display panel are disposed in one-to-one correspondence, that is, the light emitted by the light-emitting elements may directly irradiate the pixel opening regions. In this way, compared with the conventional display module, on the one hand, the light irradiating the pixel opening regions in the display panel is increased, and the light irradiating the opaque regions in the display panel is reduced, so that more light is emitted from the pixel opening regions for display, and light loss caused by back light irradiation to the opaque regions is reduced, furthermore, the utilization efficiency of the light from the light-emitting elements is improved, and the effects of improving display brightness and improving display quality are achieved. On the other hand, use of optical film layer structures such as diffusers and prism sheets in the light-emitting module may be omitted, and the thickness of the glass substrate is small, which can greatly reduce the thickness of the light-emitting module, reduce the light loss caused by the optical film layer structures such as diffusers and prism sheets, further improve the light efficiency of the light-emitting elements, and achieve the effects of improving the display brightness and the display quality.

The following is a description of the above-mentioned display panel through simulation results.

Parameters of the simulation experiment are set as follows:

A display scene is set as an on-board display with a screen pixel density generally being about 200 PPI, a PPI of the pixel opening regions of the display module is set to be 214, and a distance between adjacent mini-LEDs (i.e., arrangement cycle of the mini-LEDs) is set to be 1.2705 mm with the Mini-leds used as the light-emitting elements, then for a 13-inch 10:9 on-board display screen, 33582 mini-LEDs are needed.

Structural parameters of the display module in the embodiment of the present disclosure are as follows: firstly, considering that the PPI of the pixel opening regions of the display module is 214, it is set that a PPI of the micro lenses is 300, a diameter of the micro lenses is 84.7 μm. In this case, an object distance of the micro lenses is 0.5 mm. Then, considering a focal length of the lenses and imaging effects at different angles, it is set that an image distance of a micro lens is 0.25 mm, a curvature radius of the micro lens is 0.04235 mm, and an arch height of the micro lens is 0.04235 mm. In addition, a refractive index of the low-refractive material layer is set to be 1.4.

Experiment 1: taking the light-emitting elements being Mini-leds each having a size of 0.1 mm and a brightness of 1 lumen as an example, the inventor of the present disclosure performs modeling and simulation through a simulation software, and simulation results as shown in Table 2, FIG. 6A and FIG. 6B below are obtained.

Then, according to the simulation results shown in Table 2 below, it may be seen that a brightness of a pixel opening region in the display module in the embodiment of the present disclosure is 0.599 lumen, while a brightness of a pixel opening region in the current display module is 0.44523 lumen, it may be seen that the brightness of the pixel opening regions in the display module in the embodiment of the present disclosure is better than the brightness of the pixel opening regions in the current display module. According to the simulation results shown in Table 2 below, it may be seen that light efficiency of the light-emitting elements in the display module after performing dot matrix splitting through the micro lens array and the low-refractive material layer in the embodiment of the present disclosure is 59.9%, and light efficiency of the light-emitting elements in the current display module is 44.523%. It may be seen that the light efficiency of the light-emitting elements in the display module in the embodiment of the present disclosure is also better than that of the light-emitting elements in the current display module. Here, the light efficiency of the light-emitting elements is a ratio between luminous flux received by the pixel opening regions and luminous flux emitted by the light-emitting elements.

Figure 6A:
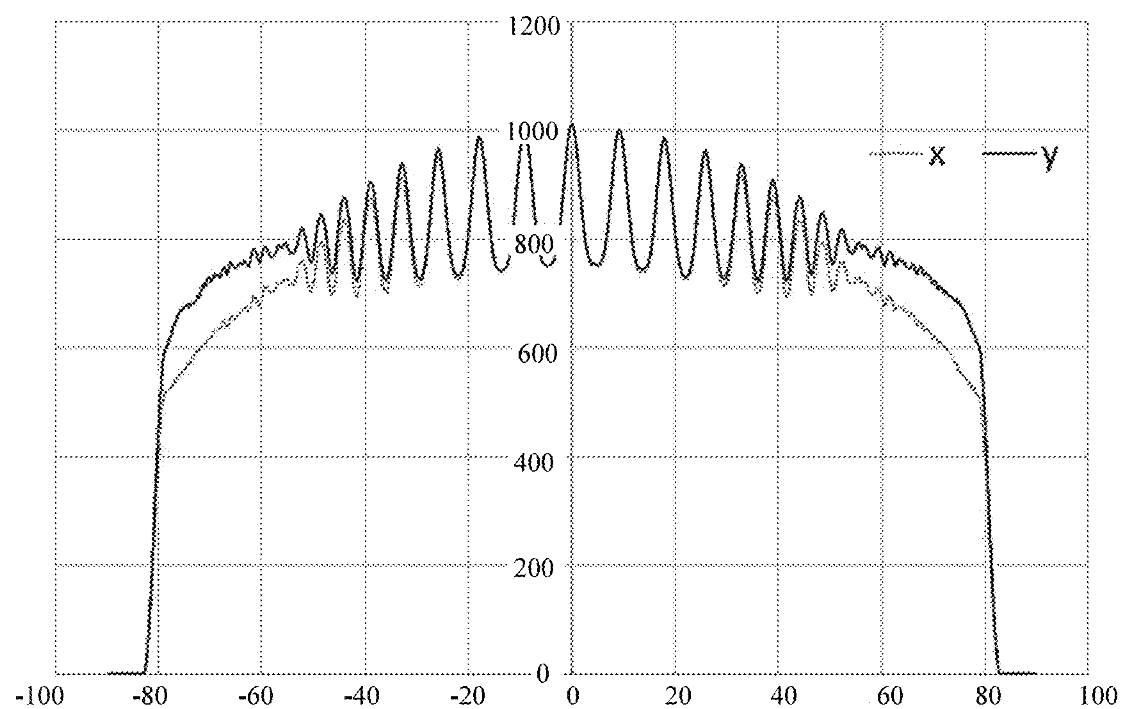
FIG. 6A is a brightness distribution diagram of a pixel opening region in the current display module.
Figure 6B:
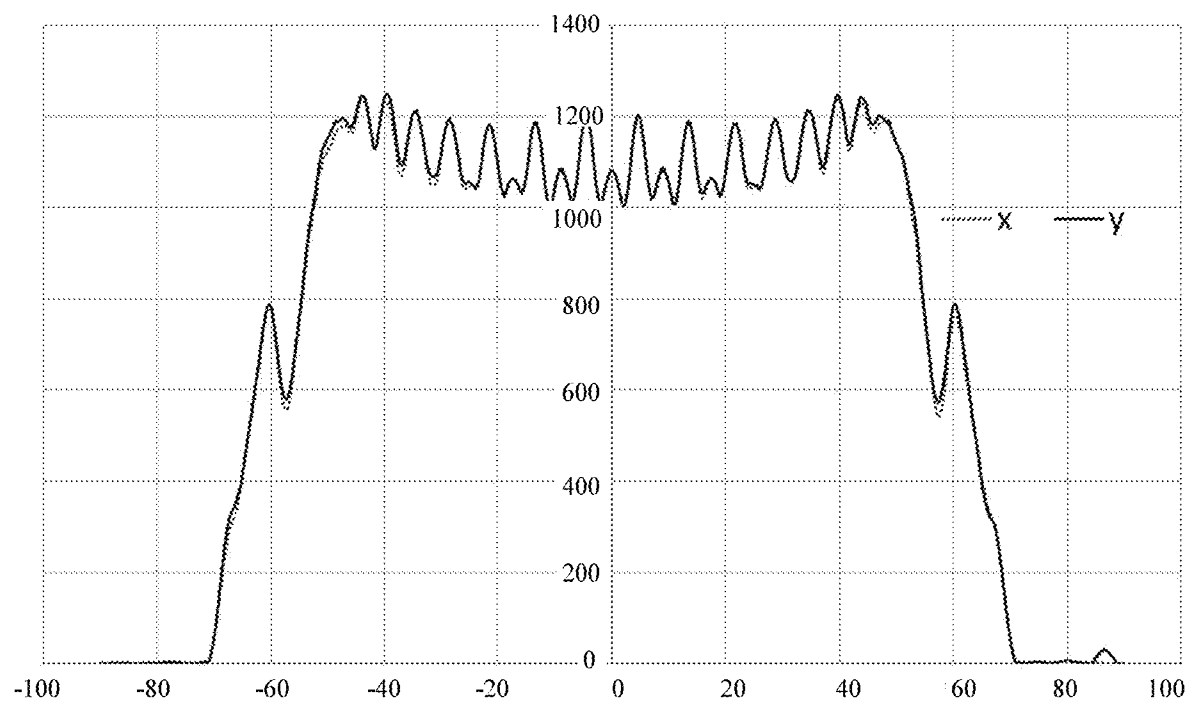
FIG. 6B is a brightness distribution diagram of a pixel opening region in a display module according to an embodiment of the present disclosure.

In addition, according to brightness distribution of pixel opening regions in the current display module as shown in FIG. 6A and brightness distribution of the pixel opening regions in the display module in the embodiment of the present disclosure as shown in FIG. 6B, the brightness distribution of the pixel opening regions in the display module in the embodiment of the present disclosure is better than that of the pixel opening regions in the current display module in both horizontal and vertical directions (i.e., X direction and Y direction). Herein, X direction may refer to a row direction of the pixel array (i.e., a row direction of the micro lens array) in the display module and Y direction may refer to a column direction of the pixel array (i.e., a column direction of the micro lens array) in the display module.

TABLE 2

Simulation Results of Single Light-emitting Element

| | Brightness of Light-emitting Element (Unit: lumen) | Brightness of Pixel Opening Region (Unit: lumen) | Light efficiency of Light-emitting Element (%) |
|---|---|---|---|
| Single Mini-led + Opaque Region | 1 | 0.44523 | 44.523 |
| Single Mini-led + Micro lens array + Low-refractive Material layer + Opaque region | 1 | 0.599 | 59.9 |

Experiment 2: taking an example in which the light-emitting elements are a Mini-led array disposed in a two-dimensional array with a cycle of 1.2705 mm, wherein a size of each Mini-led is 0.1 mm and a brightness of each Mini-led is 1 lumen, the inventor of the present disclosure performs modeling and simulation through a simulation software, and simulation results shown in Table 3, FIG. 6C and FIG. 6D below may be obtained.

Then, according to the simulation results shown in Table 3 below, it may be seen that a brightness of a pixel opening region in the display module in the embodiment of the present disclosure is 29.009 lumen, while a brightness of a pixel opening region in the current display module is 21.306 lumen, it may be seen that the brightness of the pixel opening region in the display module in the embodiment of the present disclosure is better than the brightness of the pixel opening region in the current display module. According to the simulation results shown in Table 3 below, it may be seen that light efficiency of the light-emitting elements in the display module after performing dot matrix splitting through the micro lens array and the low-refractive material layer in the embodiment of the present disclosure is 59.202%, and light efficiency of the light-emitting elements in the current display module is 43.482%. It may be seen that the light efficiency of the light-emitting elements in the display module in the embodiment of the present disclosure is also better than that of the light-emitting elements in the current display module.

Figure 6C:
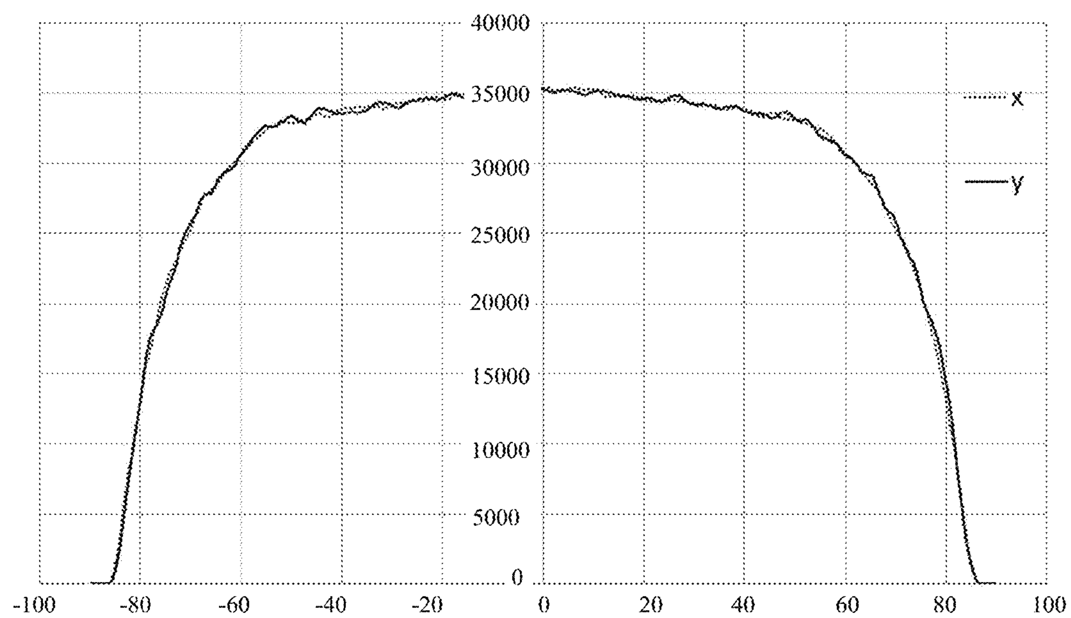
FIG. 6C is another brightness distribution diagram of a pixel opening region in the current display module.
Figure 6D:
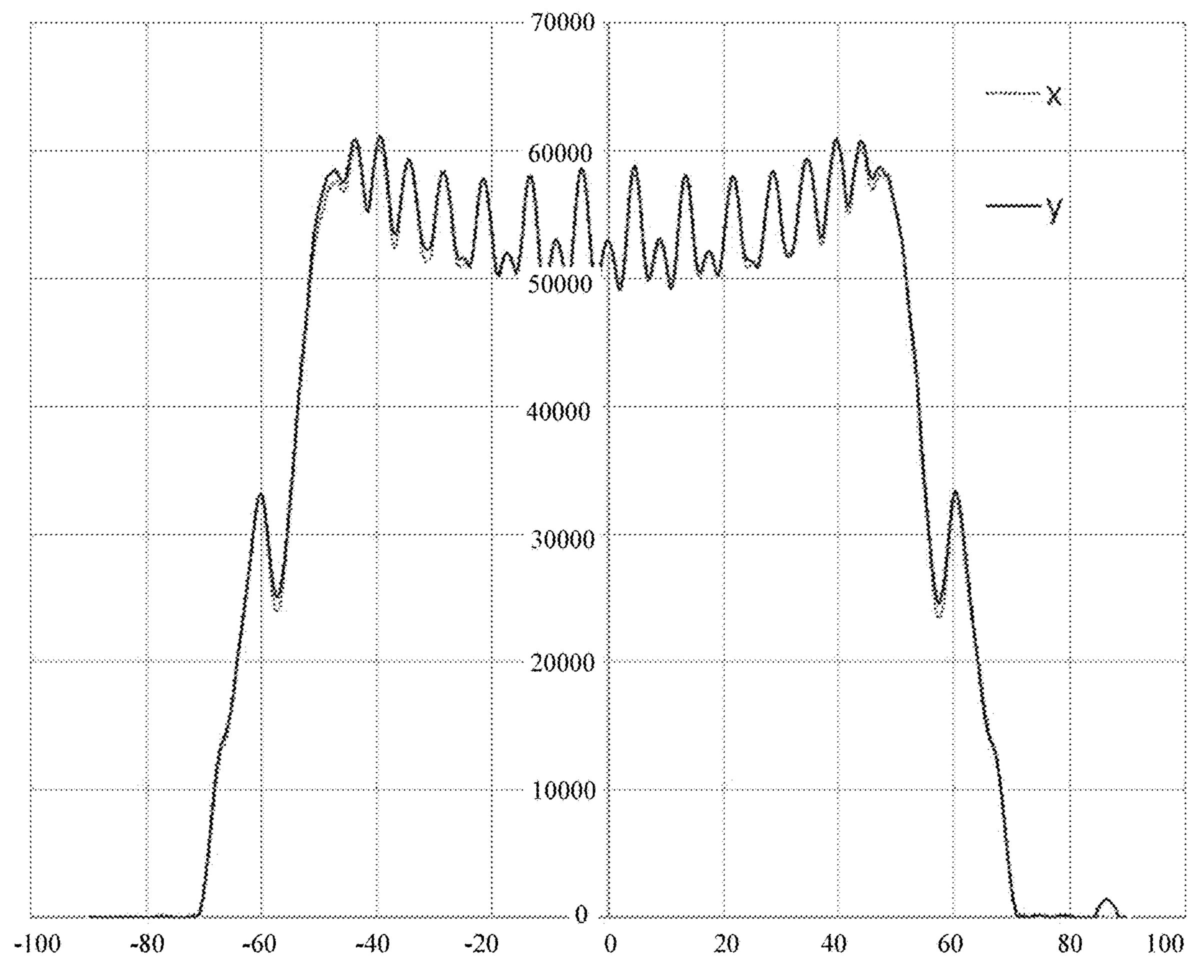
FIG. 6D is another brightness distribution diagram of a pixel opening region in a display module according to an embodiment of the present disclosure.

In addition, according to brightness distribution of pixel opening regions in the current display module as shown in FIG. 6C and the pixel opening regions in the display module in the embodiment of the present disclosure as shown in FIG. 6D, the brightness distribution of the pixel opening regions in the embodiment of the present disclosure is better than that of the pixel opening regions in the current display module in both horizontal and vertical directions (i.e., X direction and Y direction).

TABLE 3

Simulation Results of Light-emitting Element Array

| | Luminance of Light-emitting Elements (Unit: lumen) | Luminance of Pixel Opening Regions (Unit: lumen) | Light efficiency of Light-emitting Elements (%) |
|---|---|---|---|
| Mini-led Array + Opaque Regions | 49 | 21.306 | 43.482 |
| Mini-led Array + Micro lens Array + Low-refractive Material Layer + Opaque Regions | 49 | 29.009 | 59.202 |

In the above simulation experiment, for the sake of convenience, when simulating the current display module, light loss caused by optical film layers such as diffusers and a prism sheets is not taken into consideration, while only light efficiency of light emitted by the light-emitting elements after passing through a glass substrate irradiating the pixel opening regions in an ideal state is simulated. It may be seen from FIGS. 6A to 6D that without considering an influence on light efficiency by the optical film layers such as diffusers and prism sheets, light efficiency of the light-emitting elements in the display module in the embodiment of the present embodiment using the micro lens array and the low-refractive material layer for dot matrix splitting is about 1.35 times higher than that of the light-emitting elements in the current display module. Moreover, brightness uniformity of the pixel opening regions is greater than 82% after the display module in the embodiment of the present embodiment performs dot matrix splitting using the micro lens array and the low-refractive material layer. Therefore, considering the light loss caused by optical film layers such as diffusers and prism sheets, the simulation results of brightness of pixel opening regions and light efficiency of light-emitting elements of the current display module are actually worse. In a scheme according to the embodiment of the present disclosure, the light efficiency of the light-emitting elements and the brightness of the pixel opening regions obtained by using micro lens arrays for dot matrix splitting will be better.

In addition, the above-mentioned light-emitting module may include other structures or film layers besides the above-mentioned structures or film layers, for example, the light-emitting module may further include an LED light source encapsulation layer, a Quantum Dots (QD) film, a drive circuit layer (or a metal wiring layer), etc., which is not limited here in the embodiments of the present disclosure.

In addition, the above-mentioned display module may include other structures or film layers besides the light-emitting module and the display panel. For example, the display module may further include polarizers, liquid crystal layers, color film substrates, glass cover plates, etc., which is not limited here in the embodiments of the present disclosure.

An embodiment of the present disclosure further provides a display device including the display panel in one or more of the aforementioned embodiments.

In an exemplary embodiment, a display device may be any product or component with a display function such as a display, a mobile phone, a tablet, a television, a laptop computer, a digital photo frame, a navigator, etc. Other essential components included by the display device which should be understood by those of ordinary skills in the art will not be described repeatedly herein, and should not be taken as a limitation on the present disclosure.

Although the implementation modes of the present disclosure are disclosed above, the contents are only implementation modes used to easily understand the present disclosure and not intended to limit the present disclosure. Any person skilled in the art to which the present disclosure pertains may make any modifications and variations in the form and details of implementations without departing from the essence and the scope of the present disclosure, but the protection scope of the present disclosure shall still be subject to the scope defined in the appended claims.

What is claimed is:

1. A light-emitting module, comprising:

a plurality of light-emitting elements, a micro lens array disposed on a light-emitting side of the plurality of light-emitting elements, and a low-refractive material layer disposed on a side of the micro lens array away from the light-emitting elements, wherein a refractive index of the low-refractive material layer is smaller than a refractive index of the micro lens array; and light emitted by the light-emitting elements is processed by the micro lens array and the low-refractive material layer to form a dot matrix light source which irradiates a plurality of preset opening regions disposed at intervals.

2. The light-emitting module of claim 1, wherein a refractive index of the low-refractive material layer is 1.2 to 1.4, and/or a refractive index of the micro lens array is 1.492 to 1.6.

3. The light-emitting module of claim 1, wherein a thickness of the low-refractive material layer is greater than or equal to a maximum thickness of micro lenses in the micro lens array in a thickness direction of the light-emitting module, and smaller than an image distance of the micro lenses in the micro lens array.

4. The light-emitting module of claim 1, wherein the micro lens array comprises a plurality of micro lenses disposed in a row direction and a column direction, wherein a distance between adjacent light-emitting elements in the row direction is larger than a distance between adjacent micro lenses in the row direction, and/or a distance between adjacent light-emitting elements in the column direction is larger than a distance between adjacent micro lenses in the column direction.

5. The light-emitting module of claim 4, wherein the distance between the adjacent light-emitting elements in the row direction is a first integer multiple of the distance between the adjacent micro lenses in the row direction; and the distance between the adjacent light-emitting elements in the column direction is a first integer multiple of the distance between the adjacent micro lenses in the column direction.

6. The light-emitting module of claim 5, wherein the first integer is any one integer ranging from 2 to 20.

7. The light-emitting module of claim 1, further comprising a first substrate and a second substrate, wherein the first substrate is disposed on a side of the micro lens array close to the plurality of light-emitting elements, and a refractive index of the first substrate is larger than the refractive index of the low-refractive material layer; and the second substrate is disposed on a side of the low-refractive material layer away from the plurality of light-emitting elements, and a refractive index of the second substrate is greater than the refractive index of the low-refractive material layer.

8. The light-emitting module of claim 7, wherein an object distance of micro lenses in the micro lens array is a thickness of the first substrate;

an image distance of the micro lenses in the micro lens array is a thickness of the second substrate; and the thickness of the first substrate is greater than the thickness of the second substrate.

9. The light-emitting module of claim 8, wherein the thickness of the first substrate is 0.5 mm and/or the thickness of the second substrate is 0.016 mm to 0.4 mm.

10. The light-emitting module of claim 1, wherein the micro lens array is made of any one of polymethyl methacrylate and cycloolefin copolymer.

11. The light-emitting module of claim 1, wherein a surface of a micro lens in the micro lens array away from the light-emitting elements is a curved surface convex towards a direction away from the light-emitting elements, wherein the curved surface is a part of a spherical surface.

12. The light-emitting module of claim 10, wherein structural parameters of the micro lens array comprise:

one or more of a diameter of a single micro lens being 5.08 μm to 127 μm, a curvature radius of a single micro lens being 0.0028 mm to 0.064 mm, and an arch height of a single micro lens being 0.0016 mm to 0.064 mm.

13. A display module, comprising a light-emitting module and a display panel on a light-emitting side of the light-emitting module, wherein, the light-emitting module comprises a plurality of light-emitting elements, a micro lens array disposed on a light-emitting side of the plurality of light-emitting elements, and a low-refractive material layer disposed on a side of the micro lens array away from the plurality of light-emitting elements, wherein a refractive index of the low-refractive material layer is smaller than a refractive index of the micro lens array; and after being processed by the micro lens array and the low-refractive material layer, light emitted by the light-emitting elements forms a dot matrix light source which irradiates a plurality of preset opening regions which are disposed at intervals;

the display panel comprises a plurality of pixel opening regions and opaque regions disposed between adjacent pixel opening regions; and the plurality of preset opening regions are disposed in correspondence with the plurality of pixel opening regions.

14. The display module of claim 13, wherein an orthographic projection region of the plurality of preset opening regions in a thickness direction of the display panel at least partially overlaps with an orthographic projection region of the plurality of pixel opening regions in the thickness direction of the display panel.

15. The display module of claim 13, wherein the micro lens array comprises a plurality of micro lenses disposed in a row direction and a column direction, wherein, a distance between adjacent light-emitting elements in the row direction is larger than a distance between adjacent pixel opening regions in the row direction, and/or a distance between adjacent light-emitting elements in the column direction is larger than a distance between adjacent pixel opening regions in the column direction.

16. The display module of claim 15, wherein, the distance between the adjacent light-emitting elements in the row direction is a second integer multiple of the distance between the adjacent pixel opening regions in the row direction; and the distance between the adjacent light-emitting elements in the column direction is the second integer multiple of the distance between the adjacent pixel opening regions in the column direction.

17. The display module of claim 16, wherein the second integer is any one integer ranging from 2 to 20.

18. The display module of claim 13, wherein a distance between light-emitting surfaces of the plurality of light-emitting elements and a light incident surface of the display panel is 0.5 mm to 1.5 mm in a thickness direction of the display module.

19. A display device, comprising a display module, the display module comprising a light-emitting module and a display panel on a light-emitting side of the light-emitting module, wherein, the light-emitting module comprises a plurality of light-emitting elements, a micro lens array disposed on a light-emitting side of the plurality of light-emitting elements, and a low-refractive material layer disposed on a side of the micro lens array away from the plurality of light-emitting elements, wherein a refractive index of the low-refractive material layer is smaller than a refractive index of the micro lens array; and after being processed by the micro lens array and the low-refractive material layer, light emitted by the light-emitting elements forms a dot matrix light source which irradiates a plurality of preset opening regions which are disposed at intervals;

the display panel comprises a plurality of pixel opening regions and opaque regions disposed between adjacent pixel opening regions; and the plurality of preset opening regions are disposed in correspondence with the plurality of pixel opening regions.

* * * * *